United States Patent [19]
Oshikawa

[11] Patent Number: 5,210,042
[45] Date of Patent: May 11, 1993

[54] METHOD OF PRODUCING SEMICONDUCTOR DEVICE

[75] Inventor: Yoshihiro Oshikawa, Mizusawa, Japan

[73] Assignee: Fujitsu Limited, Kawasaki, Japan

[21] Appl. No.: 648,323

[22] Filed: Jan. 29, 1991

Related U.S. Application Data

[63] Continuation of Ser. No. 654,629, Sep. 26, 1984, abandoned.

[30] Foreign Application Priority Data

Sep. 26, 1983 [JP] Japan ................................ 58-177259

[51] Int. Cl.⁵ .......................................... H01L 21/266
[52] U.S. Cl. ..................................... 437/28; 437/29; 437/187; 437/191; 437/192
[58] Field of Search ........... 148/DIG. 105, DIG. 106, 148/DIG. 145, DIG. 117; 357/71, 91; 437/28, 29, 30, 41, 47, 192, 193, 191, 919, 187, 245

[56] References Cited

U.S. PATENT DOCUMENTS

| | | | |
|---|---|---|---|
| 3,775,192 | 11/1973 | Beale | 148/DIG. 145 X |
| 4,025,364 | 5/1977 | Smith | 148/DIG. 117 X |
| 4,080,718 | 3/1978 | Richman | 29/576 B X |
| 4,173,063 | 11/1979 | Kniepkamp et al. | 148/DIG. 145 X |
| 4,224,733 | 9/1980 | Spadea | 29/576 B X |
| 4,290,187 | 9/1981 | Stein | 29/576 B |
| 4,297,782 | 11/1981 | Ito | 29/576 B |
| 4,466,172 | 8/1984 | Batra | 29/576 B X |

FOREIGN PATENT DOCUMENTS

| | | | |
|---|---|---|---|
| 0142252 | 5/1985 | European Pat. Off. | |
| 0151334 | 11/1980 | Japan | 29/576 B |

OTHER PUBLICATIONS

Rideout, IBM Tech. Disc. Bull. vol. 21, No. 9 (Feb. 1979), pp. 3823-3825.

*Primary Examiner*—George Fourson
*Attorney, Agent, or Firm*—Armstrong, Westerman, Hattori, McLeland & Naughton

[57] ABSTRACT

A method for producing a semiconductor device including the steps of forming an insulating layer on a semiconductor substrate; forming a first layer of an electrode material on the insulating layer; introducing impurities into the semiconductor substrate through the first layer of the electrode material and the insulating layer by using an ion implanting process; forming a second layer of an electrode material on the first layer thereof; and forming on the impurity region an electrode pattern consisting of the first and the second layer of the electrode material and having the insulating layer below it by selectively etching the second and the first layer of the electrode material.

8 Claims, 4 Drawing Sheets

METHOD OF PRODUCING SEMICONDUCTOR DEVICE

This application is a continuation of application Ser. No. 654,629 filed Sep. 26, 1984 now abandoned.

BACKGROUND OF THE INVENTION

(1) Field of the Invention

The present invention relates to a method for producing a semiconductor device, more particularly to a method for producing a semiconductor device wherein, after a gate oxide layer or a capacitor oxide layer is formed, an impurity region is formed below the oxide layer.

(2) Description of the Prior Art

An impurity region may be provided below a capacitor electrode for forming a junction capacitance in a dynamic random-access memory (RAM), below a tunnel gate in an electric erasable programmable read-only memory (EEPROM), or below a gate electrode for controlling the threshold voltage in a metal-insulated semiconductor (MIS) transistor. Such a region is formed by forming a gate oxide layer or a capacitor oxide layer on the semiconductor substrate and implanting impurity ions into the substrate through the oxide layer.

When an impurity region is formed and then the oxide layer is formed, implanted impurities such as boron ions are diffused down and decrease the impurity concentration at the surface of the impurity region while impurities such as phosphorus ions or arsenic ions are piled up to increase the impurity concentration at the surface of the impurity region. Either of these phenomena results in deviations in the capacitance of a capacitor in a dynamic RAM, the amount of charge injection in an EEPROM, or the threshold voltage in a MIS transistor.

Consequently, an impurity region is usually formed by first forming a thin oxide layer acting as a capacitor oxide layer, tunnel gate oxide layer, or gate oxide layer by using a thermal oxidation process and then implanting the required impurity ions into a semiconductor substrate through the thin oxide layer.

Conventionally, the implantation of the impurity ions has been performed through the thin oxide layer from directly above using a resist layer as a mask. If the resist layer contains contaminants, the surface of the semiconductor substrate may be contaminated by the resist layer. Further, after the impurity implantation, the chemicals used to remove the resist layer contaminate or etch the thin oxide layer, thereby deteriorating the properties of the thin layer, decreasing the layer thickness thereof, and thus deteriorating the stability of the characteristics of the resultant device. Since the thin oxide layer is eventually applied with a high electric field during device operation and its dielectric characteristic is vital to the device operation, the resultant device is particularly vulnerable to the contamination of this thin oxide layer during the manufacturing process.

SUMMARY OF THE INVENTION

An object of the present invention is to eliminate the above-mentioned problems.

Another object of the present invention is to provide a method for producing a semiconductor device wherein impurity regions are formed without deteriorating the properties of the overlying oxide layer.

Still another object of the present invention is to improve the production yield, properties, and reliability of semiconductor devices such as dynamic RAM's, EEPROM's, and MIS transistors.

To attain the above-mentioned objects, according to the present invention, there is provided a method for producing a semiconductor device including the steps of forming an insulating layer on a semiconductor substrate; forming a first layer of an electrode material on the insulating layer; introducing impurities into the semiconductor substrate through the first layer of the electrode material and the insulating layer by using an ion implanting process; forming a second layer of an electrode material on the first layer; and forming on the impurity region an electrode pattern of the first and the second layer of the electrode material on the insulating layer by selectively etching the second and the first layer of the electrode material.

BRIEF DESCRIPTION OF THE DRAWINGS

The features of the present invention will become clearer from the ensuring description of preferred embodiments made in reference to the accompanying figures, in which.

DESCRIPTION OF THE PREFERRED EMBODIMENTS

A process for production of a dynamic RAM according to an embodiment of the present invention will first be explained. FIGS. 1A to 1J are cross-sectional views of the process.

Figure 1A:
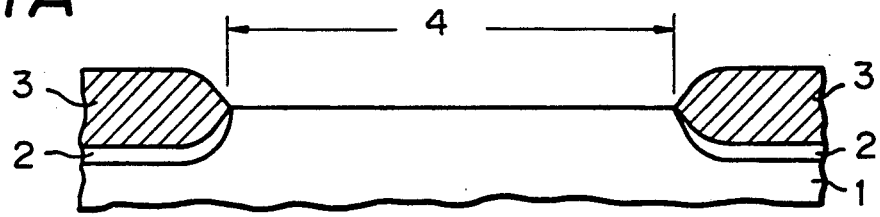
FIGS. 1A to 1J are cross-sectional views of a process for production of a dynamic RAM according to an embodiment of the present invention.

As shown in FIG. 1A, a field oxide layer 3 having a thickness of about 6,000 Å A is formed on a p-type silicon substrate 1 having a specific resistance of about 10 ohm-cm and having a p-type channel cut region 2. Specifically, this is achieved by the steps of forming a silicon nitride ($Si_3N_4$) layer (not shown) on a RAM element formation region 4, implanting boron ions into the p-type silicon substrate 1 at an energy of 60 keV and to a dosage of $2 \times 10^{13}$ atoms per $cm^2$ using the silicon nitride layer as a mask, selectively oxidizing the substrate 1 using the silicon nitride layer as a mask, and then removing the silicon nitride layer. Thus the RAM element formation region 4 isolated by the field oxide layer 3 is formed.

Figure 1B:
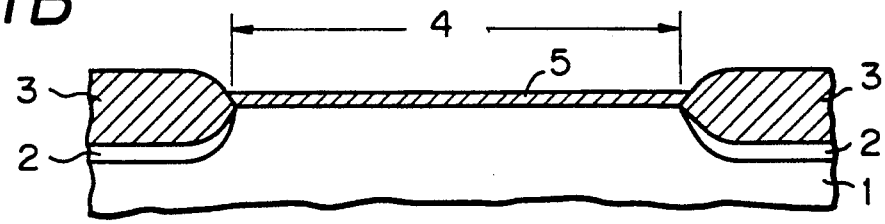

As shown in FIG. 1B, capacitor oxide layer 5 having a thickness of about 50 to 300 Å A is formed on the p-type silicon substrate 1 of the RAM element formation region 4 by a usual thermal oxidation process.

Figure 1C:
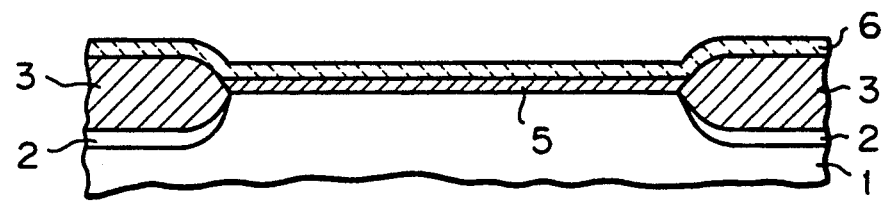

As shown in FIG. 1C, a first polycrystalline silicon layer 6 having a thickness of about 500 to 700 Å is formed on the obtained structure by a usual chemical vapor deposition (CVD) process.

Figure 1D:
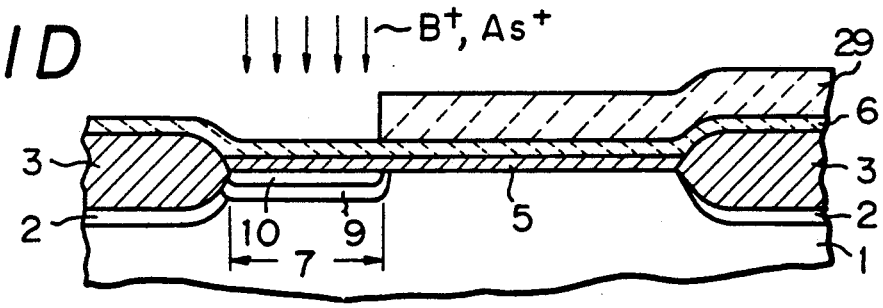

As shown in FIG. 1D, a first resist layer 29 having a thickness of about 10,000 Å is formed on the first polycrystalline silicon layer 6. Then, the first resist layer 29 is patterned by photolithography on the RAM element formation region so that an opening exposing an upper portion of a capacitor formation region 7 is formed.

After that, using the resist layer 29 as a mask, first, boron ions (B+) are selectively implanted into the substrate 1 through the first polycrystalline silicon layer 6 and the capacitor oxide layer 5 at an energy of 200 keV and to a dosage of $1 \times 10^{13}$ atoms per cm$^2$. Subsequently arsenic ions (As+) are implanted at an energy of 150 keV and to a dosage of $5 \times 10^{13}$ atoms per cm$^2$. Thus, a boron region 9 and an arsenic region 10 are formed in the capacitor formation region 7. In the ion implantation process, contaminants (not shown) contained in the implanting chamber may be introduced into the implanting surface by the knock-on phenomena. Since the capacitor oxide layer 5 is not exposed to the implanting surface, it is not contaminated. A degenerated layer of the resist layer 29 is formed on the upper surface of the resist layer 8 by the impact of ions on the resist layer 29.

Figure 1E:
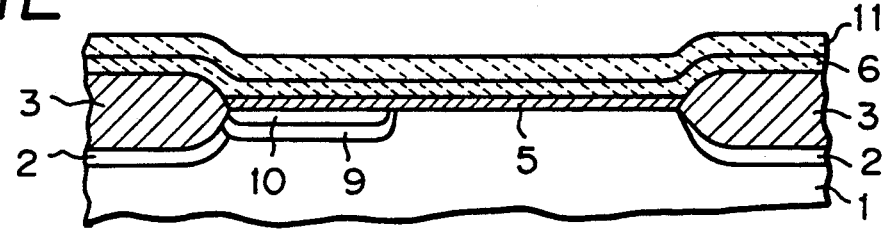

As shown in FIG. 1E, the first resist layer 29 is removed by a usual ashing process using oxygen gas plasma and a wet treatment using sulfuric acid (H$_2$SO$_4$). Subsequently, a wet etching process using hydrogen fluoride (HF) may be carried out to remove an extremely thin oxide layer which is likely to be formed on the surface of the polycrystalline layer during the implanting process.

Since the capacitor oxide layer 5 is not exposed to these processes, it is not contaminated and its thickness is not decreased.

Then, on the first polycrystalline silicon layer 6, a second polycrystalline silicon layer 11 having a thickness of about 3,000 to 4,000 Å is formed to ensure a sufficient thickness of polycrystalline silicon to make an electrode. Impurities of phosphorus ions or the like are implanted into the second polycrystalline silicon layer 11 to give a low resistivity thereto.

Figure 1F:
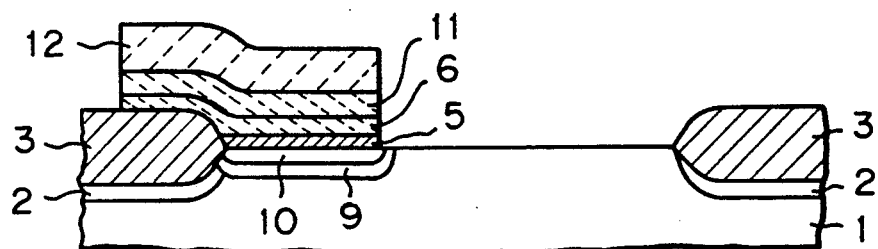

As shown in FIG. 1F, a resist layer 12 is formed on the second polycrystalline silicon layer 11, and then is patterned by a usual photolithography process to leave just the portion directly above the arsenic region 10 and the part of the field oxide layer 3 ranging along the arsenic region 10. The exposed part of the second polycrystalline silicon layer 11 is etched by a reactive ion etching (RIE) process using the patterned resist layer 12 as a mask. Subsequently, the exposed part of the first polycrystalline silicon layer 6 is etched by the same process. After that, the exposed part of the capacitor oxide layer 5 is etched by the RIE process.

In the RIE process for the polycrystalline silicon layer and the capacitor oxide layer, a mixture of carbon tetra fluoride (CF$_4$) and oxygen and trifluoromethane (CHF$_3$) are used, respectively, as an etching gas. The etching gas pressure is usually adjusted to about 0.01 to 0.1 torr, and the high frequency electric power is usually set to 0.2 to 0.3 watt/cm$^2$.

Figure 1G:
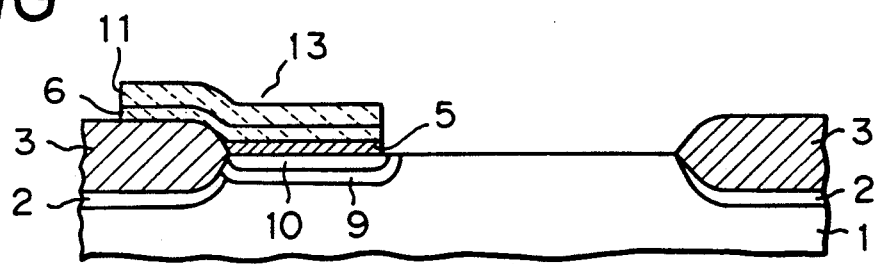

As shown in FIG. 1G, the second resist layer 12 is removed by a usual ashing process whereby a Hi-C structure capacitor is realized. The Hi-C structure capacitor consists of the arsenic region 10, which, when activated, becomes an n+-type region and the boron region 9, which, when activated, becomes a p+-type region; the capacitor oxide layer 5 positioned above the p-n junction portion; and a polycrystalline silicon capacitor electrode 13 composed of the first and second polycrystalline silicon layers 6 and 11. After that, conventional production process are carried out.

Figure 1H:
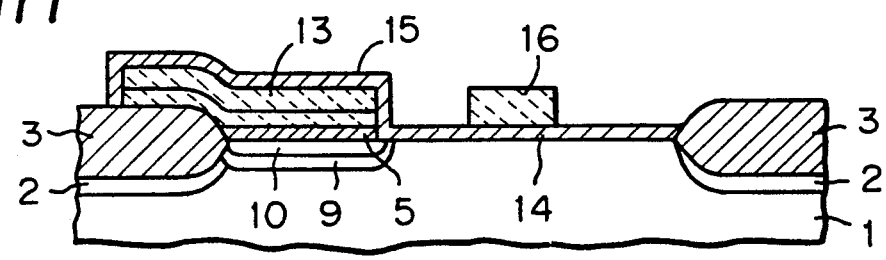

As shown in FIG. 1H, a gate oxide layer 14 having a thickness of about 300 to 500 Å is formed on the exposed part of the p-type silicon substrate 1 by a usual thermal oxidation process. Simultaneously, a second oxide layer 15 is formed over the polycrystalline silicon capacitor electrode 13.

On the obtained structure, a third polycrystalline silicon layer having a thickness of about 4,000 to 5,000 Å is formed by the CVD process. After giving conductivity to the third polycrystalline silicon layer by implanting impurities thereto, the third polycrystalline silicon layer is patterned by the photolithography process to form a polysilicon gate electrode 16 on the gate oxide layer 14.

Figure 1I:
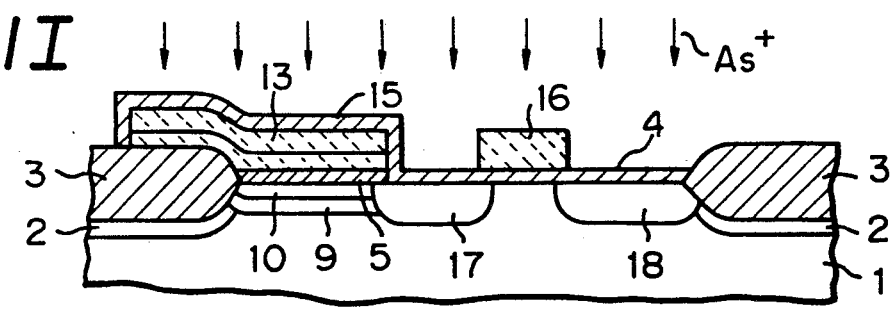

As shown in FIG. 1I, high concentration of arsenic ions are implanted into the p-type silicon substrate 1 through the exposed portion of the gate oxide layer 14 using the polycrystalline silicon gate electrode 16 and the polycrystalline silicon capacitor electrode 13 as a mask.

After the ion implantation process, the required annealing is carried out so that an n+-type source region 17 and n+-type drain region 18 are formed in the p-type silicon substrate 1. During the annealing process, the boron region 9 and the arsenic region 10 are activated to become p+-type and n+-type regions, respectively.

Figure 1J:
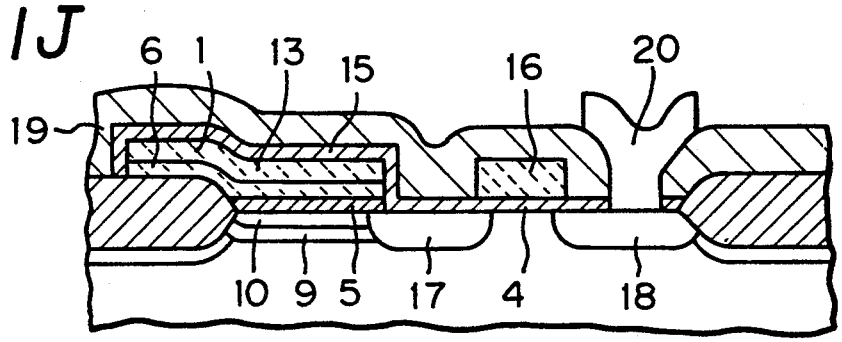

As shown in FIG. 1J, on the obtained structure, a phospho-silicate glass (PSG) layer 19, for example, is formed by the CVD process. An electrode window is formed by etching the PSG layer 19 and the gate oxide layer 14 using a photolithography process. Then, an aluminum layer is formed over the obtained structure by vacuum evaporation or sputtering. The aluminum layer is patterned by the photolithography process to form aluminum wiring 20 on the PSG layer 19 through the electrode window. The wiring 20 is electrically connected to the drain region 18, the gate electrode 16, and the capacitor electrode 13. The connection of the aluminum wiring 20 to the gate electrode 16 and the capacitor electrode 13 is carried out at another region (not shown). Thus after the formation of a protective insulating layer on the obtained structure, the production of a dynamic RAM is completed.

Next, a process for production of an EEPROM according to an embodiment of the present invention will be explained. FIGS. 2A to 2I are cross-sectional views of the process.

Figure 2A:
FIGS. 2A to 2I are cross-sectional views of a process for production of an EEPROM according to another embodiment of the present invention.
Figure 2B:
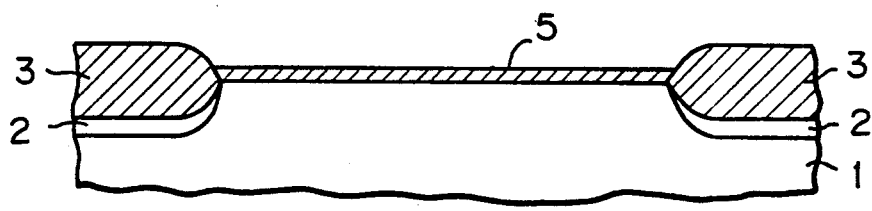

First, referring to FIGS. 2A and 2B, the same processes as in FIGS. 1A and 1B are carried out.

Figure 2C:
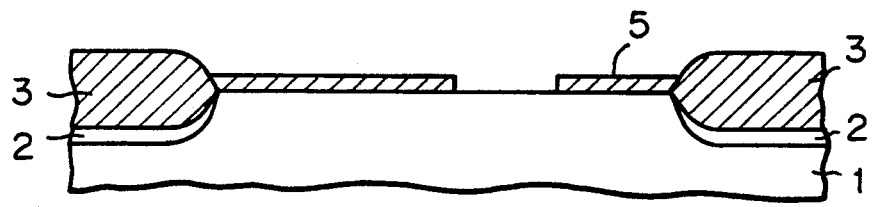

Then, as shown in FIG. 2C, a part of an oxide layer 5 is etched by a usual photolithography process to form an opening.

Figure 2D:
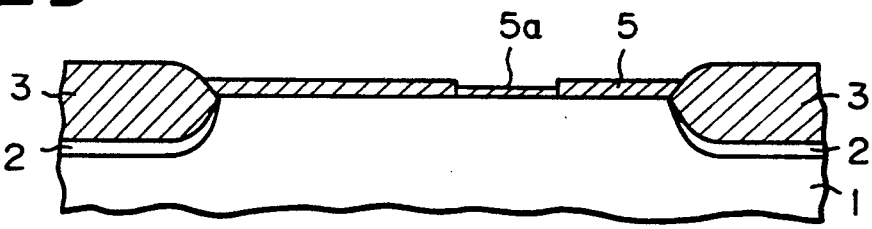
Figure 2E:
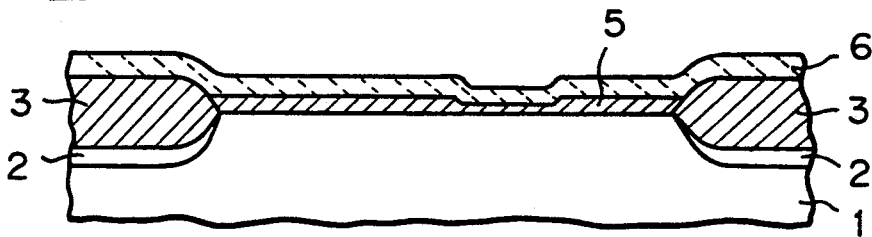

As shown in FIG. 2D, a tunnel gate oxide layer 5a having a thickness of about 100 to 200 Å is formed on the exposed p-type silicon substrate 1. After that, on the obtained structure, a first polycrystalline silicon layer 6 having a thickness of 500 to 700 Å is formed as shown in FIG. 2E.

Figure 2F:
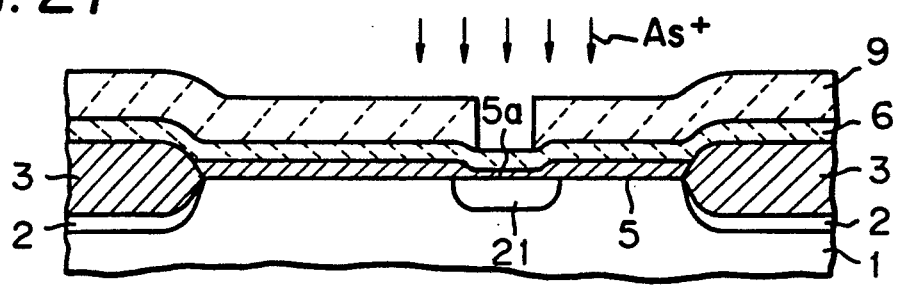

Then, as shown in FIG. 2F, a resist layer 9 having an opening is formed on the polycrystalline silicon layer 6, then arsenic ions are implanted into the p-type silicon substrate 1 through the polycrystalline silicon layer 6 and the tunnel gate oxide layer 5a to form an impurity region 21 for electron injection or discharge.

Figure 2G:
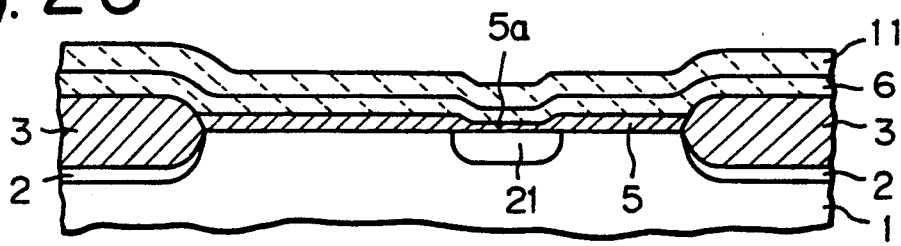

As shown in FIG. 2G, a second polycrystalline silicon layer 11 having a thickness of about 3,000 to 5,000 Å is formed on the first polycrystalline silicon layer 6 and an ion implantation process is carried out to give the layer 11a low resistivity. Subsequently, a patterned resist layer (not shown) is formed over the polycrystalline silicon layers 10 and then the polycrystalline layer 6 and 10 are etched, with the resist layer used as a mask to form a preliminary pattern for forming the floating gate pattern.

Figure 2H:
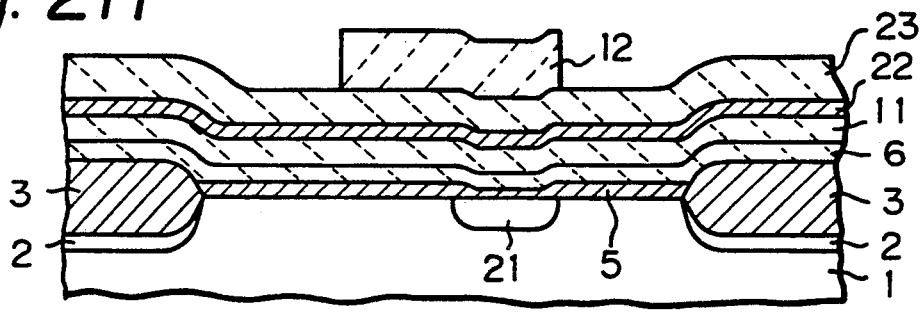

As shown in FIG. 2H, on the obtained structure, a second gate oxide layer 22 having a thickness of 400 to 700 Å is formed by a usual thermal oxidation process. After that, a polycrystalline silicon layer 23 for a control electrode is formed on the second gate oxide layer 22 and an ion implantation process for rendering the layer 23 conductive is carried out. Then, a patterned resist layer is formed on the polycrystalline silicon layer 23 above the impurity region 21 for electron injection or discharge.

Figure 2I:
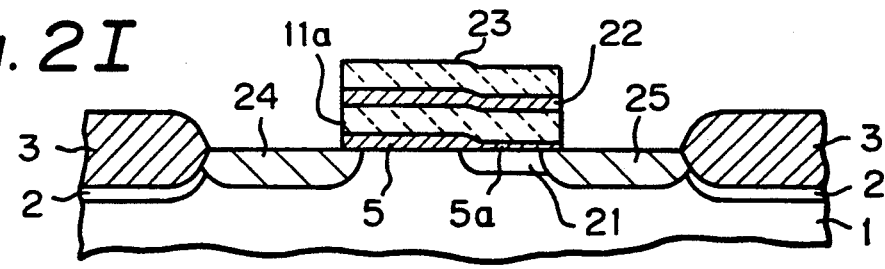

As shown in FIG. 2I, the polycrystalline silicon layer 23 for a control electrode, the second gate oxide layer 22, the second polycrystalline silicon layer 11, the first polycrystalline silicon layer 6, and the oxide layer 5 are etched in turn by the RIE process using the patterned resist layer 12 as a mask. The thus formed floating gate 11a consists of the first and the second polycrystalline silicon layers 11 and 6. Then, arsenic ions are implanted to the p-type silicon substrate 1 to form a source region 24 and a drain region 25. Thus, the EEPROM can be obtained according to the present invention.

Figure 3:
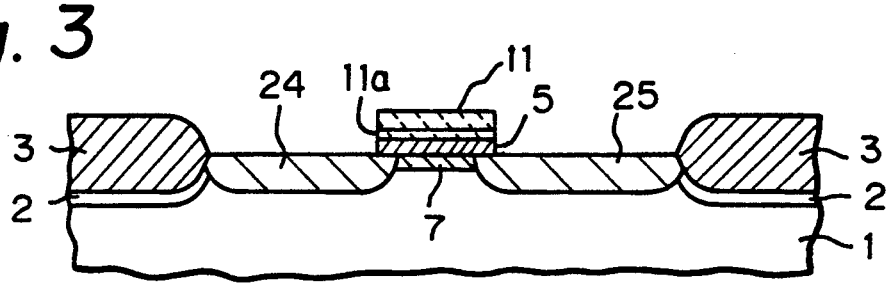
FIG. 3 is a cross-sectional view of a MIS transistor according to another embodiment of the present invention.

FIG. 3 is a cross-sectional view of an MIS transistor according to another embodiment of the present invention.

An impurity region 7 for adjusting the threshold voltage is formed by implantation of either boron, arsenic or phosphorus ion through the first polycrystalline silicon layer forming the lower layer of the polycrystalline silicon layer 11a and through a gate oxide layer 5.

In the present invention, the electrode material layer is not limited to polycrystalline silicon. Refractory metals, such as molybdenum or tungsten and titanium or metal silicide of these metals, may also be used. The first layer electrode material may also be different from the second-layer electrode material.

It will be obvious to those skilled in the art that there are many possible modifications and variations of the above described process. These modifications and variations do not depart from the scope of the invention.

I claim:

1. A method for producing a semiconductor device without deteriorating an insulating layer, said method comprising the steps of:
   forming said insulating layer on a semiconductor substrate having a single conductivity type, the insulating layer having a specified thickness;
   forming a first layer of an electrode material on the insulating layer, the first layer having a selected thickness;
   forming a masking layer having an opening on said first layer;
   selectively introducing impurities into the semiconductor substrate via said opening and through said first layer and said insulating layer by using opposite conductivity type ion implanting to form an impurity region having an opposite conductivity type from that of said semiconductor substrate;
   forming a second layer of an electrode material on the first layer and in direct contact therewith, said second layer having, with said first layer, a sufficient thickness to form an electrode; and
   forming, on the impurity region, an electrode pattern, which comprises the first and second layer of the electrode material coextending over the insulating layer and forming a single level electrode or wiring, by selectively etching the second and first layer of the electrode material, said specified thickness of said insulating layer and said selected thickness of said first layer having a combined thickness to permit passage of boron ions and arsenic ions therethrough to achieve a specified depth of a boron region and a selected depth of an arsenic region in said substrate, wherein said first and second layers consist essentially of the same material; and wherein in said step of forming a first layer of an electrode material on the insulating layer, said first layer of an electrode material is formed with a thickness in the range of 500 to 700 Å.

2. A method according to claim 1, wherein said semiconductor substrate is a p-type semiconductor substrate.

3. A method according to claim 1, wherein said first layer and said second layer of an electrode material consist of a material selected from the group consisting of polycrystalline silicon, refractory metals, and refractory metal silicides.

4. A method according to claim 3, wherein said first and said second layers of electrode material are selected from the group consisting of molybdenum, tungsten, and titanium.

5. A method for producing a semiconductor device without deteriorating an insulating layer, said method comprising the steps of:
   forming said insulating layer on a semiconductor substrate having a single conductivity type, the insulating layer having a specified thickness in a range of 50 to 300 Å;
   forming a first layer of an electrode material on the insulating layer, the first layer having a selected thickness in a range of 500 to 700 Å;
   forming a masking layer having an opening on said first layer;
   selectively introducing impurities into the semiconductor substrate via said opening and through said first layer and said insulating layer by using opposite conductivity type ion implanting to form an impurity region having an opposite conductivity type from that of said semiconductor substrate;
   forming a second layer of an electrode material on the first layer and in direct contact therewith, said second layer having a thickness in a range of 3,000 to 4,000 Å and having, with said first layer, a sufficient thickness to form an electrode; and
   forming, on the impurity region, an electrode pattern, which comprises the first and second layer of the electrode material coextending over the insulating layer and forming a single level electrode or wiring, by selectively etching the second and first layer of the electrode material, said specified thickness of said insulating layer and of said first layer having a combined thickness to permit passage of boron ions and arsenic ions therethrough to achieve a specified depth of a boron region and a selected depth of an arsenic region in said substrate, wherein said first and second layers consist essentially of the same material.

6. A method according to claim 5, wherein said semiconductor substrate is a p-type semiconductor substrate.

7. A method according to claim 1, wherein said first layer and said second layer of an electrode material consist of a material selected from the group consisting of polycrystalline silicon, refractory metals, and refractory metal silicides.

8. A method according to claim 7, wherein said first and said second layers of electrode material are selected from the group consisting of molybdenum, tungsten, and titanium.

* * * * *